United States Patent
Kido

(10) Patent No.: US 11,277,951 B2
(45) Date of Patent: Mar. 15, 2022

(54) DISTURBANCE COMPENSATION SYSTEM FOR MOVING BODIES OF A MOUNTING HEAD OF COMPONENT MOUNTING APPARATUS

(71) Applicant: FUJI CORPORATION, Chiryu (JP)

(72) Inventor: Takashi Kido, Kariya (JP)

(73) Assignee: FUJI CORPORATION, Chiryu (JP)

( * ) Notice: Subject to any disclaimer, the term of this patent is extended or adjusted under 35 U.S.C. 154(b) by 191 days.

(21) Appl. No.: 16/493,156

(22) PCT Filed: Mar. 29, 2017

(86) PCT No.: PCT/JP2017/012824
§ 371 (c)(1),
(2) Date: Sep. 11, 2019

(87) PCT Pub. No.: WO2018/179120
PCT Pub. Date: Oct. 4, 2018

(65) Prior Publication Data
US 2020/0077552 A1    Mar. 5, 2020

(51) Int. Cl.
*H05K 13/08* (2006.01)
*G05B 19/4155* (2006.01)
*H05K 13/04* (2006.01)

(52) U.S. Cl.
CPC ..... *H05K 13/0882* (2018.08); *G05B 19/4155* (2013.01); *H05K 13/04* (2013.01); *G05B 2219/39421* (2013.01)

(58) Field of Classification Search
CPC .. G05B 11/32; G05B 13/024; G05B 19/4155; G05B 2219/39421; H05K 13/0882; H05K 13/04
See application file for complete search history.

(56) References Cited

U.S. PATENT DOCUMENTS

| 10,452,050 B2 * | 10/2019 | Odai | H05K 13/0815 |
| 2020/0077552 A1 * | 3/2020 | Kido | H05K 13/0882 |

FOREIGN PATENT DOCUMENTS

| JP | 2004-104075 A | 4/2004 |
| JP | 5382777 B2 | 1/2014 |

OTHER PUBLICATIONS

International Search Report dated Jun. 20, 2017 in PCT/JP2017/012824 filed Mar. 29, 2017.

* cited by examiner

*Primary Examiner* — Minh N Trinh
(74) *Attorney, Agent, or Firm* — Oblon, McClelland, Maier & Neustadt, L.L.P.

(57) ABSTRACT

A positioning control device controlling multiple moving bodies including a disturbance non-interference-enabling compensator performing non-interference-enabling compensation of a disturbance of an feedback compensator and an operation amount of the moving body on the side affected by the disturbance is provided. The disturbance non-interference-enabling compensator includes a second differentiator to perform second-order differentiation of a position command value of a moving body on a disturbance generating side to output an acceleration command value; a first multiplier to multiply an acceleration command value output from the second differentiator by a first gain to output a correction amount of an feedback compensator of the moving body on the side affected by the disturbance; and a second multiplier to multiply an acceleration command value output from the second differentiator by a second gain to output a correction amount for an operation amount of the moving body on the side affected by the disturbance.

5 Claims, 4 Drawing Sheets

DISTURBANCE COMPENSATION SYSTEM FOR MOVING BODIES OF A MOUNTING HEAD OF COMPONENT MOUNTING APPARATUS

TECHNICAL FIELD

The present specification discloses technology related to a disturbance non-interference-enabling compensation system for positioning control device and a component mounting apparatus for controlling the position of moving bodies in a moving body driving system in which multiple moving bodies individually driven by multiple driving sources are mounted on a single machine base or multiple coupled machine bases, and disturbances generated by the acceleration and deceleration driving of any of the moving bodies are transmitted to adjacent moving bodies via the machine base.

BACKGROUND ART

As a moving body driving system in which multiple moving bodies that are individually accelerated and decelerated by multiple driving sources are mounted on a single machine base or multiple coupled machine bases, for example, a modular component mounting line described in patent literature 1 (JP-A-2004-104075) is known. The modular component mounting line has a configuration in which multiple mounter modules are connected to each other, and two moving bodies (Y slides) for moving two mounting heads are mounted on each mounter module. With this configuration, not only is disturbance (vibration), which is generated when one moving body of one mounter module is accelerated and decelerated, transmitted to the other moving body of the mounter module itself via the base, leading to deterioration of the positioning accuracy of the other moving body, there are cases in which the disturbance is also transmitted to a moving body of another mounter module via the base of the other mounter module adjacent thereto, leading to a deterioration of the positioning accuracy of the moving body of the other mounter module.

A disturbance non-interference-enabling compensation device that solves such a problem only by changing or adding software is disclosed in patent literature 2 (Japanese patent 5382777). The disturbance non-interference-enabling compensation device of patent literature 2 includes an observation means for observing (detecting) the position of a moving object, a disturbance non-interference-enabling compensator for performing non-interference-enabling compensation of the disturbance with respect to the observation amount of the moving object on the disturbance influenced side, and the disturbance non-interference-enabling compensator is configured to include: a first feedforward compensator for outputting a feedforward compensation amount for performing non-interference-enabling compensation of the disturbance with respect to the control amount of the moving object on the disturbance influenced side using the operation amount of the moving object on the disturbance generating side as an input; a second feedforward compensator for outputting a target command correction amount using the operation amount of the moving object on the disturbance generating side as an input; a first calculator for correcting the operation amount of the moving object on the disturbance influenced side using the output of the first feedforward compensator; and a second calculator for correcting the target command of the moving object on the disturbance influenced side using the output of the second feedforward compensator.

CITATION LIST

Patent Literature

Patent literature 1: JP-2004-104075
Patent literature 2: Japanese patent number 5382777

BRIEF SUMMARY

Technical Problem

The disturbance non-interference-enabling compensation device of patent literature 2 described above performs non-interference-enabling compensation of disturbance based on the operation amount of the moving body on the disturbance generating side, but since the operation amount of the moving body on the disturbance generating side includes the feedback compensation amount for a mechanical characteristic such as frictional force by normal feedback control, there is a problem that the compensation amount for performing non-interference-enabling compensation of the disturbance is liable to be affected by the mechanical characteristic of the moving body on the disturbance generating side.

Further, since the operation amount of the moving body on the disturbance generating side includes the feedback compensation amount for the mechanical characteristics such as the frictional force described above and also includes a control delay due to feedback control, even if the feedforward compensation amount for performing the non-interference-enabling compensation of the disturbance is output from the operation amount, there is a problem that a desired compensation result cannot be obtained.

Further, as described in patent literature 2, when a feedforward compensator for non-interference-enabling is constructed in consideration of an inverse characteristic of a nominal model of a transmission characteristic from the operation amount of the moving body on the side subject to the influence of the disturbance to the control amount, the feedforward compensator includes a second-order differential characteristic. As a result, the feedforward compensation amount has a fourth derivative of the position command value as a component. Thus, the operation amount (torque) is equivalent to the second derivative of the position command value multiplied by the inertia of the control object, and further multiplied by the inverse characteristic (characteristic including the second derivative) of the nominal model of the transmission characteristic from the operation amount to the control amount, so the fourth derivative of the position command value is consequently included as a component. For this reason, the physical meaning of the feed forward compensation amount becomes unknown, and it is difficult to adjust the feed forward compensation amount. Moreover, the configuration of the disturbance non-interference-enabling compensator becomes complicated, and the positioning control software with the disturbance non-interference-enabling compensator becomes complicated, resulting in a problem that the calculation load of the CPU becomes large.

Solution to Problem

To solve the above problems, disclosed herein is a disturbance non-interference-enabling compensation system of a positioning control device for controlling the position of moving bodies by a two-degree-of-freedom control system in a moving body drive system in which multiple moving bodies individually accelerated and decelerated by multiple drive sources are mounted on a single machine base or multiple connected machine bases, and disturbances generated by acceleration and deceleration driving of any of the moving bodies are transmitted to an adjacent another of the moving bodies via the machine base, the system including: a two-degree-of-freedom control system, the two-degree-of-freedom control system including: a detecting section configured to detect the position of the moving body; a feedback compensator configured to output a feedback operation amount such that a deviation between a position command value of the moving body and a detection value of the detecting section is input, the feedback operation amount being output such that the deviation is small; a feedforward compensator configured to output a feedforward operation amount using the position command value of the moving body as an input; an adder configured to output the operation amount of the moving body by adding the feedback operation amount and the feedforward operation amount; and a disturbance non-interference-enabling compensator configured to perform non-interference-enabling compensation of the disturbance with respect to the operation amount and the input of the feedback compensator of the moving body on a disturbance-receiving side, wherein the disturbance non-interference-enabling compensator includes: a second-order differentiator configured to perform second-order differentiation of the position command value of the moving body on a disturbance-generating side and output an acceleration command value, a first multiplier configured to multiply the acceleration command value that is an output of the second-order differentiator by a first gain and output a correction amount with respect to the input of the feedback compensator on the moving body on the disturbance-receiving side, and a second multiplier configured to multiply the acceleration command value that is the output of the second-order differentiator by a second gain and output a correction amount with respect to the operation amount of the moving body on the disturbance-receiving side, further wherein the disturbance non-interference-enabling compensation system of the positioning control device performs the disturbance non-interference-enabling compensation by correcting the operation amount and the input of the feedback compensator of the moving body on the disturbance-receiving side using the output of the first multiplier and the output of the second multiplier.

In general, the moving body on the disturbance-receiving side has a characteristic that the influence of the disturbance increases as the absolute value of the acceleration (deceleration) of the moving body on the disturbance-generating side increases. Focusing on this characteristic, the position command value of the moving body on the disturbance-generating side is differentiated to the second order to obtain an acceleration command value, and this acceleration command value is multiplied by a predetermined gain to obtain a correction amount with respect to the input of the feedback compensator of the moving body on the disturbance-receiving side and a correction amount with respect to the operation amount, thereby performing the non-interference-enabling compensation of the disturbance. As described above, by performing the non-interference-enabling compensation of the disturbance based on the acceleration command value of the moving body on the disturbance-generating side, it is possible to solve the problem caused by performing the non-interference-enabling compensation of the disturbance based on the operation amount of the moving body on the disturbance generating-side, as described in patent literature 2 described above.

In this case, the control system for controlling the position of each moving body is not limited to a two-degree-of-freedom control system (combination of feedback control and feedforward control), but may be a one-degree-of-freedom control system based only on feedback control.

Further, the present disclosure may be applied to a moving body driving system that accelerates and decelerates multiple moving bodies in the same direction or in the opposite direction. Since the acceleration command value obtained by second-order differentiation of the position command value depends on the moving direction of the moving body, when the moving direction of the moving body is different, the first gain and the second gain may be changed according to the moving direction of the moving object in consideration of the fact that the degree of influence of the disturbance is different depending on the moving direction of the moving object.

Further, the magnitude of the disturbance transmitted to the moving body changes in accordance with the position of the moving body on the disturbance-generating side, the position of the moving body on the disturbance-receiving side, or the distance between both. In consideration of this point, at least one of the first gain and the second gain may be changed in accordance with at least one of a position of the moving body on the disturbance-generating side and a position of the moving body on the disturbance-receiving side. Alternatively, at least one of the first gain and the second gain may be changed in accordance with a distance between the moving body on the disturbance-generating side and the moving body on the disturbance-receiving side.

Note that, the present disclosure is not limited to only one moving body on the disturbance-generating side, and is also applicable to a moving body driving system in which there are multiple moving bodies on the disturbance-generating side and multiple disturbances generated by acceleration and deceleration driving of the multiple moving bodies on the disturbance generating-side are transmitted to one moving body. In this case, the second-order differentiator, the first multiplier, and the second multiplier may be provided for each of the multiple disturbance-generating side moving bodies, and the non-interference-enabling compensation of the disturbance may be performed by correcting the operation amount and the input of the feedback compensator of the moving body on the disturbance-receiving side using a sum of outputs of the multiple first multipliers and a sum of outputs of the multiple second multipliers.

DESCRIPTION OF EMBODIMENTS

The following describes three specific embodiments applied to a component mounting apparatus.

First Embodiment

Figure 1:
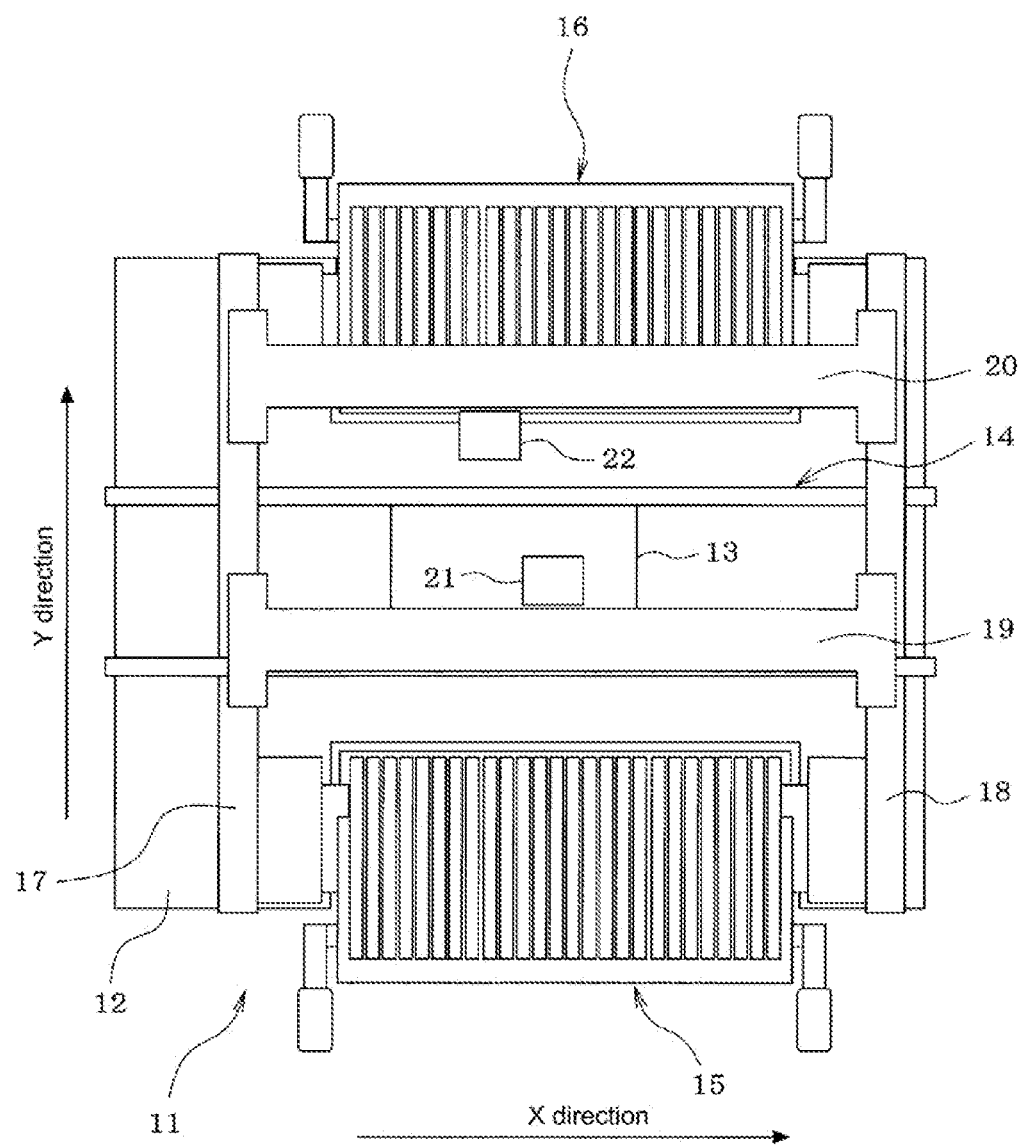
FIG. 1 is a plan view schematically showing the configuration of a component mounting apparatus of a first embodiment.

A first embodiment will be described with reference to FIGS. 1 to 3. First, the configuration of component mounting apparatus 11 will be described with reference to FIG. 1.

Conveyor 14 for conveying circuit board 13 in the X direction is provided on a center side of machine base 12 of component mounting apparatus 11, and component supply devices 15 and 16 for supplying components are provided on both sides of machine base 12 in the Y direction (a direction orthogonal to the X direction). Two Y slide bases 17 and 18 are provided in parallel along the Y direction on both sides of machine base 12 in the X direction, and two Y slides 19 and 20 (moving bodies) moving in the Y direction are provided on the two Y slide bases 17 and 18. Y slides 19 and 20 are respectively provided with mounting heads 21 and 22 via X slides (not shown), and one or multiple suction nozzles (not shown) are respectively held on mounting heads 21 and 22, and components supplied from the component supply devices 15 and 16 are picked up by the suction nozzles and mounted on circuit board 13. Although not shown, Y slides 19 and 20 are respectively provided with drive sources 23 and 24 such as a ball screw drive device or a linear motor drive device, and Y slides 19 and 20 are individually accelerated and decelerated in the Y direction by drive sources 23 and 24.

Next, the configuration of positioning control circuit 31 for individually controlling the positions (Y coordinates) of the two Y slides 19 and 20 will be described with reference to FIG. 2.

Positioning control circuit 31 of the first embodiment is configured from a two-degree-of-freedom control system in which feedback control and feedforward control are combined. Hereinafter, for convenience of description, "feedback" may be referred to as "F/B" and "feedforward" may be referred to as "F/F".

The positions of the Y slides 19 and 20 are detected by detectors 32 and 33 such as encoders or linear scales (also known as linear encoders). The detection characteristics of detecting sections 32 and 33 are represented by transmission variables H1 and H2, respectively. The two-degree-of-freedom control system for individually controlling the position of each Y slide 19, 20 includes feedback compensators 34, 35 (transmitting functions C1, C2) configured to receive the deviation between the position command values 1, 2 of each Y slide 19, 20 and the detection values of detecting sections 32, 33 and output the feedback operation amount such that the deviation is small, feedforward compensators 36, 37 (transmission functions FF1, FF2) configured to receive the position command values 1, 2 of each Y slide 19, 20 and output the feedforward operation amount, and adders 38, 39 configured to add the feedback operation amount and the feedforward operation amount and output the operation amount of each Y slide 19, 20, and driving sources 23, 24 (transmission variables P1, P2) of each Y slide 19, 20 that are targets for control are controlled by the outputs (operation amounts) of each adder 38, 39. P1, P2 represent transmission characteristics of each Y slide 19, 20 also including driving sources 23, 24.

In this case, the two Y slides 19 and 20 are affected by disturbance generated by acceleration and deceleration driving of the Y slide on the opposite side. Therefore, in the first embodiment, the two-degree-of-freedom control system for individually controlling the positions of Y slides 19 and 20 includes disturbance non-interference-enabling compensators 41 and 42 configured to perform non-interference-enabling compensation of the disturbance with respect to the inputs and the operation amounts of feedback compensators 34 and 35 of Y slides 19 and 20 on the side affected by the disturbance generated by the acceleration and deceleration driving of the Y slide on the respective opposite side.

For example, when disturbance generated by acceleration and deceleration driving of Y slide 19 is transmitted to Y slide 20 via machine base 12, disturbance non-interference-enabling compensator 41 for non-interference-enabling compensation of the disturbance includes: second-order differentiator 43 configured to perform second-order differentiation of the position command value of Y slide 19 on a disturbance-generating side and output an acceleration command value, a first multiplier configured to multiply the acceleration command value that is an output of second-order differentiator 43 by a first gain (Kp1) and output a correction amount with respect to the input of the feedback compensator 35 on the Y slide 20 on the disturbance-receiving side, and second multiplier 47 configured to multiply the acceleration command value that is the output of the second-order differentiator by a second gain (KU) and output a correction amount with respect to the operation amount of the Y slide 20 on the disturbance-receiving side, and the disturbance non-interference-enabling compensation system of the positioning control device performs the disturbance non-interference-enabling compensation by correcting the operation amount and the input of feedback compensator 35 of Y slide 20 on the disturbance-receiving side using the output of first multiplier 45 and the output of second multiplier 47.

Figure 2:
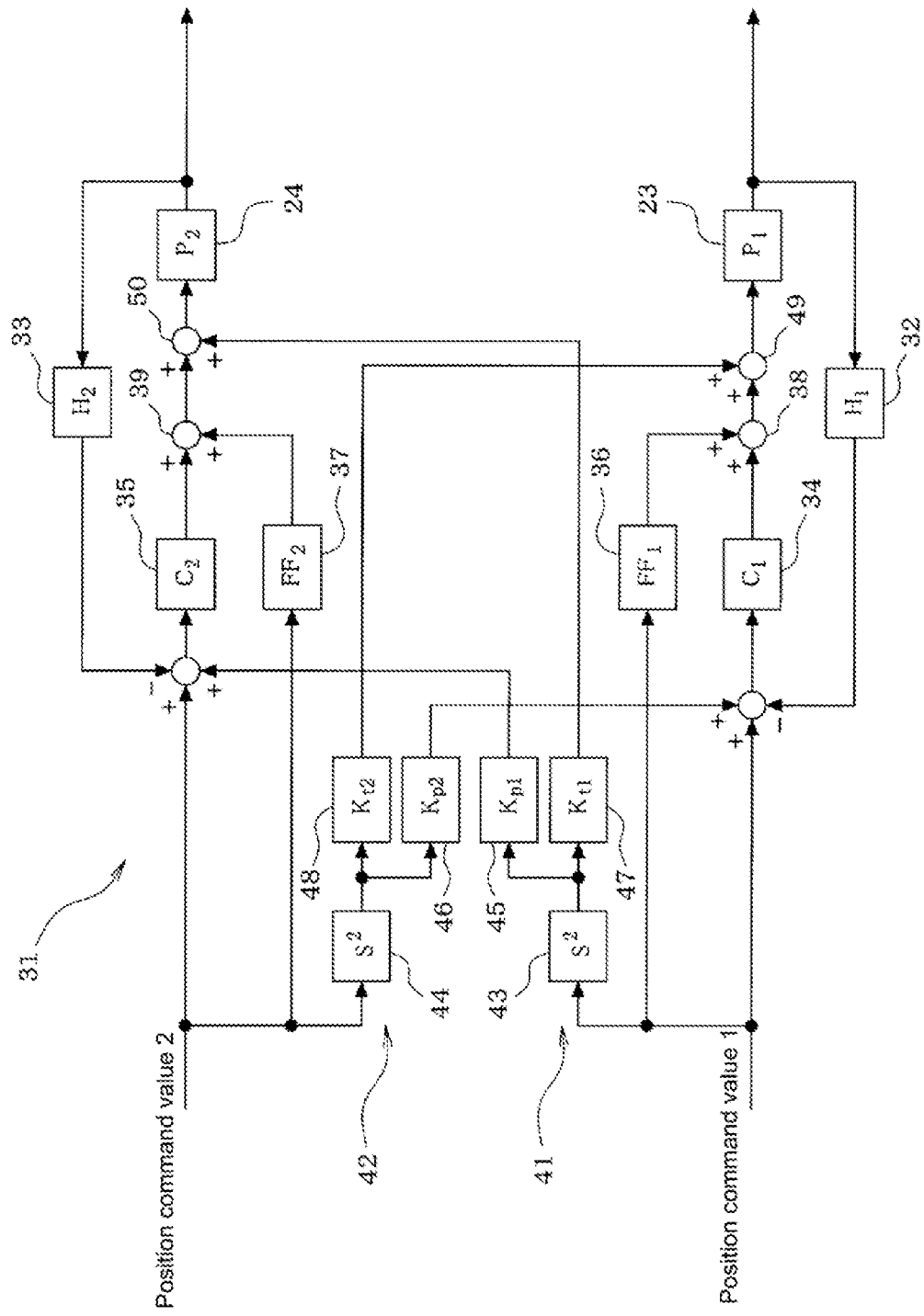
FIG. 2 is a block diagram showing a configuration of a positioning control device and a disturbance non-interference-enabling compensation system according to the first embodiment.

Note that, in the configuration example of FIG. 2, adder 50 configured to add the output of second multiplier 47 to the operation amount that is the output of adder 39 of Y slide 20 on the disturbance-receiving side is provided to correct the operation amount, but adder 50 may be omitted and the output of second multiplier 47 may be input to adder 39 to correct the operation amount.

On the other hand, when disturbance generated by acceleration and deceleration driving of Y slide 19 is transmitted to Y slide 20 via machine base 12, disturbance non-interference-enabling compensator 42 for non-interference-enabling compensation of the disturbance includes: second-order differentiator 44 configured to perform second-order differentiation of the position command value of Y slide 20 on a disturbance-generating side and output an acceleration command value, first multiplier 46 configured to multiply the acceleration command value that is an output of second-order differentiator 44 by a first gain (Kp2) and output a correction amount with respect to the input of the feedback compensator 34 on the Y slide 19 on the disturbance-receiving side, and second multiplier 48 configured to multiply the acceleration command value that is the output of the second-order differentiator by a second gain (Kt2) and output a correction amount with respect to the operation amount of the Y slide 19 on the disturbance-receiving side, and the disturbance non-interference-enabling compensation system of the positioning control device performs the disturbance non-interference-enabling compensation by correcting the operation amount and the input of feedback compensator 34 of Y slide 19 on the disturbance-receiving side using the output of first multiplier 46 and the output of second multiplier 48.

Note that, in the configuration example of FIG. 2, adder 49 configured to add the output of second multiplier 48 to the operation amount that is the output of adder 38 of Y slide 19 on the disturbance-receiving side is provided to correct the operation amount, but adder 49 may be omitted and the output of second multiplier 48 may be input to adder 38 to correct the operation amount.

That is, the Y slide on the disturbance-receiving side has a characteristic that the influence of the disturbance increases as the absolute value of the acceleration (deceleration) of the Y slide on the disturbance-generating side increases. Focusing on this characteristic, in the first embodiment, the position command value of the Y slide on the disturbance-generating side is differentiated to the second order to obtain an acceleration command value, and this acceleration command value is multiplied by a predetermined gain (first gain and second gain) to obtain a correction amount with respect to the input of the feedback compensator of the Y slide on the disturbance-receiving side and a correction amount with respect to the operation amount, thereby performing the non-interference-enabling compensation of the disturbance.

Further, the magnitude of the disturbance transmitted to the Y slide changes in accordance with the position of the Y slide on the disturbance-generating side, the position of the Y slide on the disturbance-receiving side, or the distance between both. In consideration of this point, at least one of the first gain and the second gain may be changed in accordance with at least one of a position of the Y slide on the disturbance-generating side and a position of the Y slide on the disturbance-receiving side. Alternatively, at least one of the first gain and the second gain may be changed in accordance with a distance between the Y slide on the disturbance-generating side and the Y slide on the disturbance-receiving side. However, in order to simplify the software for performing the non-interference-enabling compensation of the disturbance, the first gain and the second gain may be fixed values set in advance.

Figure 3:
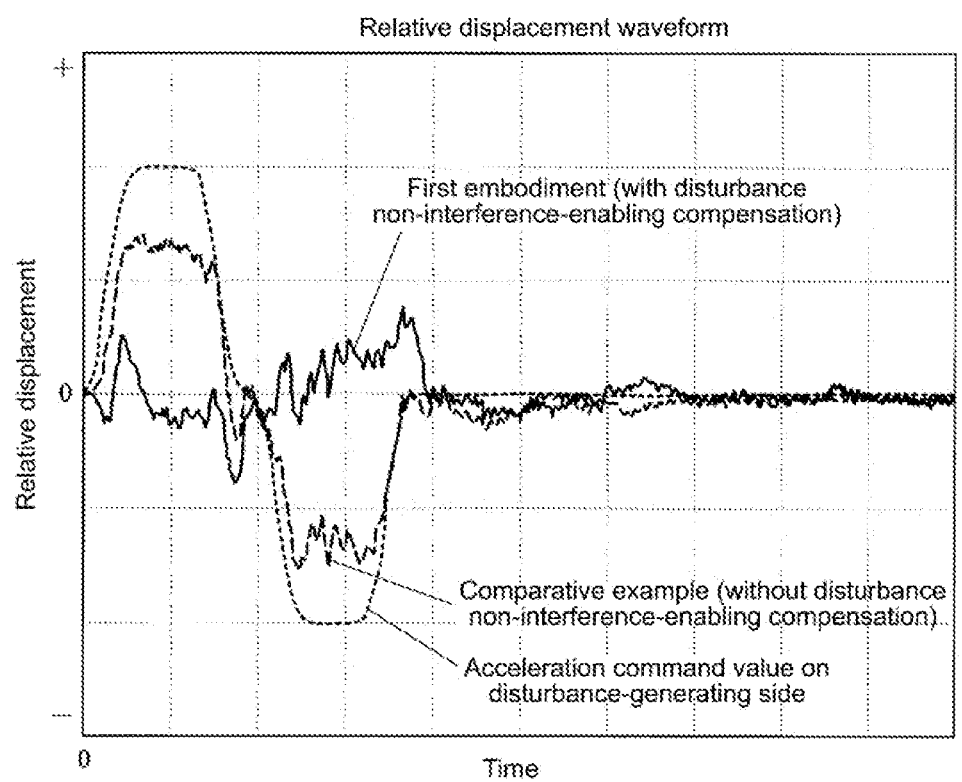
FIG. 3 is a relative displacement waveform diagram for explaining a relative displacement suppression effect by the disturbance non-interference-enabling compensation of the first embodiment.

In order to confirm the effect of the disturbance non-interference-enabling compensation of the first embodiment, the inventors simultaneously drove two Y slides 19 and 20 to measure the relative displacement between the suction nozzle tip of the mounting head of the Y slide on the side affected by the disturbance and the conveyor 14 (circuit board 13), and the measurement results are shown in FIG. 3. FIG. 3 shows a comparison between the acceleration command value obtained by second-order differential of the position command value of the Y slide on the disturbance-generating side (output of the second-order differentiator), the relative displacement when the disturbance non-interference-enabling compensation of the first embodiment is performed, and the relative displacement of a comparative example in which the disturbance non-interference-enabling compensation is not performed. The greater the absolute value of the relative displacement between the suction nozzle tip and conveyor 14 (circuit board 13), the greater the influence of the disturbance generated by the acceleration and deceleration driving of the Y slide on the disturbance-generating side, and the worse the component mounting accuracy and the lower the component pickup rate.

According to the measurement results of the relative displacement of FIG. 3, the relative displacement in a case where the disturbance non-interference-enabling compensation is performed in the first embodiment is reduced by half compared to the relative displacement in a comparative example in which the disturbance non-interference-enabling compensation is not performed. Therefore, with the first embodiment, even if the two Y slides 19 and 20 are simultaneously driven, it is possible to prevent deterioration of the component mounting accuracy and lowering of the component pickup rate due to the disturbance generated by the acceleration and deceleration driving of the Y slide on the disturbance-generating side. In addition, the effect of the disturbance non-interference compensation eliminates the need to increase the rigidity of machine base 12, the Y slide bases 17, 18, and the like of component mounting apparatus 11 more than necessary, and component mounting apparatus 11 can be reduced in weight.

Since the disturbance non-interference-enabling compensators 41 and 42 of the first embodiment described above calculate the acceleration command value by second-order differentiation of the position command value of the Y slide on the disturbance-generating side, and multiply this acceleration command value by a predetermined gain (first gain and second gain) to calculate the correction amount for the input of the feedback compensator of the Y slide on the side affected by the disturbance and the correction amount for the operation amount, and thereby perform the non-interference-enabling compensation of the disturbance, it is possible to solve the problem caused by performing the non-interference-enabling compensation of the disturbance based on the operation amount of the moving object on the disturbance-generating side, as in patent literature 2 described above.

That is, since the disturbance non-interference-enabling compensators 41 and 42 of the first embodiment do not use the feedback compensation amount for a mechanical characteristic such as frictional force of the Y slide on the disturbance-generating side, the compensation amount for non-interference-enabling of the disturbance is hardly affected by the mechanical characteristic of the Y slide on the disturbance-generating side. In addition, since a control delay by feedback control is not included, it is possible to accurately calculate the compensation amount for non-interference-enabling of the disturbance while waiting for the influence of the mechanical characteristic of the Y slide on the disturbance-generating side described above, and it is possible to increase the effect of the non-interference-enabling compensation of the disturbance as compared with the above-described patent literature 2.

Further, since the disturbance non-interference-enabling compensators 41 and 42 of the first embodiment have a simple configuration in which the position command value of the Y slide on the disturbance-generating side is only second-order differentiated and multiplied by the gain, it is possible to simplify the positioning control software of the two-degree-of-freedom control system with the disturbance non-interference-enabling compensators 41 and 42, and it is possible to reduce the calculation load of the CPU. Moreover, since the disturbance non-interference-enabling compensators 41 and 42 of the first embodiment only include the second derivative of the position command value and do not include the fourth derivative, there is an advantage that the adjustment is easy.

Second Embodiment

Figure 4:
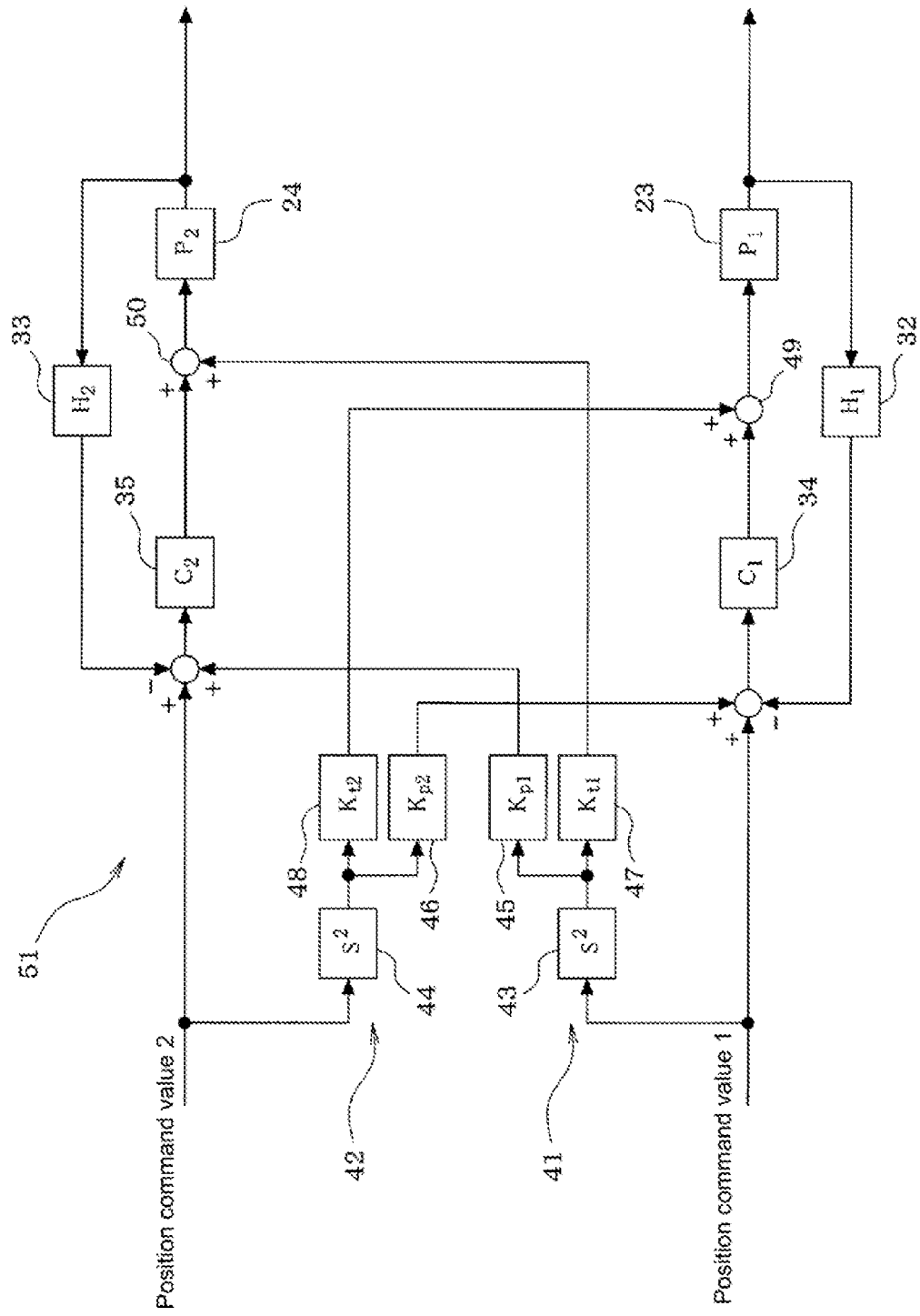
FIG. 4 is a block diagram showing the configuration of the positioning control device and the disturbance non-interference-enabling compensation system according to a second embodiment.

Next, a second embodiment is described using FIG. 4. However, for portions that are effectively the same as in the first embodiment above, the same symbols will be assigned and description will be omitted or simplified, and description will mainly be given of different portions.

In the first embodiment, positioning control circuit 31 for individually controlling the positions of the two Y slides 19 and 20 is configured by a two-degree-of-freedom control system (a combination of feedback control and feedforward control), but in a second embodiment, positioning control circuit 51 for individually controlling the positions of the two Y slides 19 and 20 is constituted by a one-degree-of-freedom control system using only feedback control.

Also in the second embodiment, the one-degree-of-freedom control system (feedback control system) that individually controls the positions of Y slides 19 and 20 includes disturbance non-interference-enabling compensators 41 and 42 that perform non-interference-enabling compensation of the disturbance with respect to the input and the operation amount of the feedback compensator of the Y slide on the side affected by the disturbance generated by the acceleration and deceleration driving of the Y slide on the respective opposite sides. The configuration of each of the disturbance non-interference-enabling compensators 41 and 42 is the same as that of the first embodiment.

Even when positioning control circuit 51 for individually controlling the positions of the two Y slides 19 and 20 is configured by a one-degree-of-freedom control system using only feedback control as in the second embodiment described above, the same effect as in the first embodiment can be obtained by providing disturbance non-interference-enabling compensators 41 and 42 as in the first embodiment.

Note that, in the first and second embodiments described above, the non-interference compensation of disturbance is performed between two Y slides 19 and 20 provided on machine base 12 of one component mounting apparatus 11, but only one Y slide may be provided on the machine base of one component mounting apparatus, and multiple component mounting machines may be connected, with disturbance generated by the acceleration and deceleration driving of the Y slide of an adjacent component mounting apparatus being transmitted to the Y slide of another adjacent component mounting apparatus via the machine base. In this case, similar non-interference-enabling compensation of disturbance as in embodiments 1 and 2 may be performed between the Y slides of two adjacent component mounting machines.

Third Embodiment

In the above-described embodiments 1 and 2, only one Y slide on the disturbance generating side is used, but in a third embodiment, there are multiple Y slides on the disturbance generating side, and multiple disturbances generated by acceleration and deceleration driving of the multiple Y slides on the disturbance generating side are transmitted to one Y slide. For example, as shown in FIG. 1, two Y slides 19 and 20 are provided on the machine base 12 of one component mounting apparatus 11, and multiple component mounting apparatuses 11 are connected to each other, so that disturbance generated by acceleration and deceleration driving of Y slides 19 and 20 of adjacent component mounting apparatuses 11 may be transmitted to Y slides 19 and 20 of an adjacent component mounting apparatus 11 via machine base 12.

In this case, a second-order differentiator, a first multiplier, and a second multiplier similar to those in the first and second embodiments may be provided for each of the Y slides on the disturbance generating side, and the input and the operation amount of the feedback compensator on the Y slide on the side affected by the disturbance may be corrected by the sum of the outputs of the multiple first multiplications and the sum of the outputs of the multiple second multipliers of the Y slides on the disturbance generating side to perform the non-interference-enabling compensation of the disturbance.

By doing so, even when there are multiple Y slides on the disturbance generating side and multiple disturbances generated by acceleration and deceleration driving of the multiple Y slides on the disturbance generating side are transmitted to one Y slide, it is possible to perform non-interference compensation of multiple disturbances generated by acceleration and deceleration driving of the multiple Y slides on the disturbance generating side, and it is possible to prevent deterioration of component mounting accuracy and deterioration of the component pickup rate due to multiple disturbances.

Other Embodiments

In the first to third embodiments described above, the Y slide drive system is used as a moving body drive system for accelerating and decelerating multiple moving bodies in the same direction or in the opposite direction, but the present disclosure may be applied to a moving body drive system for accelerating and decelerating multiple moving bodies other than a Y slide in the same direction or in the opposite direction. Since the acceleration command value obtained by second-order differentiation of the position command value depends on the moving direction of the moving body, if the present disclosure is applied to a moving body driving system that accelerates and decelerates multiple moving bodies in the same direction or in the opposite direction, it is possible to perform non-interference-enabling compensation of disturbance, as in the first to third embodiments.

When the present disclosure is applied to a moving body driving system in which the moving directions of multiple moving bodies are different from each other, the first gain and the second gain may be changed in accordance with the moving direction of the moving body in consideration of the fact that the degree of influence of disturbance is different depending on the moving direction of the moving body.

In addition, the present disclosure is not limited to the above-mentioned first to third embodiments, and it is needless to say that the present disclosure can be implemented by various modifications within a range not deviating from the gist, such as being applicable to each device of a machine tool or a production line other than a component mounting apparatus, for example.

REFERENCE SIGNS LIST

11: component mounting apparatus;
12: machine base;
13: circuit board;
14: conveyor;
15, 16: component supply device;
17, 18: Y-slide base;
19, 20: Y slide (moving body);
21, 22: mounting head;
23, 24: driving source;
31: positioning control circuit;
32, 33: detecting section;
34, 35: feedback compensator;
36, 37: feedforward compensator;
38, 39: adder;
41, 42: disturbance non-interference-enabling compensator;
43, 44: second-order differentiator;
45, 46: first multiplier;

47, 48: second multiplier;
49, 50: adder;
51: positioning control circuit

The invention claimed is:

1. A disturbance non-interference-enabling compensation system for controlling a position of moving bodies individually accelerated and decelerated by multiple drive sources, the moving bodies being mounted on a base of a component mounting apparatus, and disturbances generated by acceleration and deceleration driving of any of the moving bodies are transmitted to an adjacent another of the moving bodies via the base of the component mounting apparatus, the system comprising:

processing circuitry including a two-degree-of-freedom control system for performing feedback control and feedforward control, the two-degree-of-freedom control system including:

a detecting section configured to detect a position of a moving body of the moving bodies;

a feedback compensator configured to output a feedback operation amount such that a deviation between a position command value of the moving body and a detection value of the detecting section is input, the feedback operation amount being output such that the deviation is small;

a feedforward compensator configured to output a feedforward operation amount using the position command value of the moving body as an input;

an adder configured to output an operation amount of the moving body by adding the feedback operation amount and the feedforward operation amount; and a disturbance non-interference-enabling compensator configured to perform non-interference-enabling compensation of the disturbance with respect to the operation amount and the input of the feedback compensator of the moving body on a disturbance-receiving side, wherein the disturbance non-interference-enabling compensator includes:

a second-order differentiator configured to perform second-order differentiation of the position command value of the moving body on a disturbance-generating side and output an acceleration command value, a first multiplier configured to multiply the acceleration command value that is an output of the second-order differentiator by a first gain and output a correction amount with respect to the input of the feedback compensator on the moving body on the disturbance-receiving side, and a second multiplier configured to multiply the acceleration command value that is the output of the second-order differentiator by a second gain and output a correction amount with respect to the operation amount of the moving body on the disturbance-receiving side, and the processing circuitry performs the disturbance non-interference-enabling compensation by correcting the operation amount and the input of the feedback compensator of the moving body on the disturbance-receiving side using the output of the first multiplier and the output of the second multiplier.

2. The disturbance non-interference-enabling compensation system according to claim 1, wherein
the moving bodies are driven to accelerate and decelerate in a same direction or in an opposite direction.

3. The disturbance non-interference-enabling compensation system according to claim 1, wherein
at least one of the first gain and the second gain is configured to change in accordance with at least one of a position of a moving body of the moving bodies on the disturbance-generating side and a position of a moving body of the moving bodies on the disturbance-receiving side.

4. The disturbance non-interference-enabling compensation system according to claim 1, wherein
at least one of the first gain and the second gain varies according to a distance between a moving body of the moving bodies on the disturbance-generating side and a moving body of the moving bodies on the disturbance-receiving side.

5. The disturbance non-interference-enabling compensation system according to claim 1, wherein
there are multiple of the moving bodies on the disturbance-generating side, multiple disturbances generated by acceleration and deceleration driving of the multiple of the moving bodies on the disturbance-generating side are transmitted to one of the other moving bodies,
the disturbance non-interference-enabling compensator is provided with the second-order differentiator, the first multiplier, and the second multiplier for each of the multiple of the moving bodies on the disturbance-generating side, and
the disturbance non-interference-enabling compensator is configured to perform non-interference-enabling compensation of the disturbances by correcting the operation amount and the input of the feedback compensator of the moving body on the disturbance-receiving side using a sum of outputs of the multiple first multipliers and a sum of outputs of the multiple second multipliers.

* * * * *